United States Patent
Redon

(10) Patent No.: US 8,048,686 B2
(45) Date of Patent: Nov. 1, 2011

(54) PRODUCTION OF A DEVICE COMPRISING MAGNETIC STRUCTURES FORMED ON ONE AND THE SAME SUBSTRATE AND HAVING RESPECTIVE DIFFERENT MAGNETIZATION ORIENTATIONS

(75) Inventor: Olivier Redon, Seyssinet Pariset (FR)

(73) Assignee: Commissariat a l'Energie Atomic, Paris (FR)

( * ) Notice: Subject to any disclaimer, the term of this patent is extended or adjusted under 35 U.S.C. 154(b) by 0 days.

(21) Appl. No.: 12/971,702

(22) Filed: Dec. 17, 2010

(65) Prior Publication Data
US 2011/0151589 A1    Jun. 23, 2011

(30) Foreign Application Priority Data
Dec. 21, 2009 (FR) .................................... 09 59312

(51) Int. Cl.
*H01L 21/00* (2006.01)
(52) U.S. Cl. ........... 438/3; 438/48; 438/52; 360/324.11; 324/249; 428/811.5

(58) Field of Classification Search .................. 257/295; 438/3, 433–437; 360/324.11; 324/52, 249; 428/811.5
See application file for complete search history.

(56) References Cited

U.S. PATENT DOCUMENTS

| 7,160,738 B2 * | 1/2007 | Deak ................................. 438/3 |
| 2003/0169543 A1 * | 9/2003 | Fujikata et al. .......... 360/324.11 |
| 2004/0137275 A1 | 7/2004 | Jander et al. |
| 2009/0289747 A1 | 11/2009 | Duraffourg et al. |

* cited by examiner

*Primary Examiner* — Dung A. Le

(57) ABSTRACT

The invention relates to a method for producing a device comprising magnetic blocks magnetized in different directions, comprising steps of:
a) forming, in a stack of one or more layers of at least one antiferromagnetic material and one or more layers of at least one ferromagnetic material resting on a substrate, at least one first block and at least one second block, said blocks being longilineal and separate and extending respectively in a first main direction and in a second main direction, the first and the second main direction forming between them a first non-zero angle α,
b) annealing said blocks at a temperature greater than the ordering temperature of said antiferromagnetic material or than the blocking temperature or than the Néel temperature of said antiferromagnetic material.

8 Claims, 3 Drawing Sheets

PRODUCTION OF A DEVICE COMPRISING MAGNETIC STRUCTURES FORMED ON ONE AND THE SAME SUBSTRATE AND HAVING RESPECTIVE DIFFERENT MAGNETIZATION ORIENTATIONS

TECHNICAL FIELD

The invention relates to the field of devices equipped with a plurality of magnetized structures formed on a substrate, and provides an improved method for producing magnetic zones having respective magnetizations of different orientations on one and the same support.

It finds applications in the field of devices for detecting and/or measuring a magnetic field, for example that of magnetic sensors of the MEMS (MEMS=Micro-electro-mechanical systems) or NEMS (NEMS=Nano-electro-mechanical systems) type, suitable for measuring magnetic fields along a plurality of axes, in particular along three axes.

It applies for example to the production of devices for measuring the Earth's magnetic field, such as devices having a compass function.

PRIOR ART

It is known to produce a magnetic sensor capable of detecting a magnetic field along 3 axes.

To do this, it proves necessary to create zones forming a magnet, having directions of magnetization that are orthogonal to one another.

The manufacture of a sensor comprising magnet zones having different magnetization orientations on one and the same substrate poses a problem.

It is known according to a first approach to deposit successively zones of different magnetization orientations on one and the same substrate, or according to a second approach to form zones of identical magnetization orientations on one and the same substrate and then to carry out a local heating of at least one of these zones in order to modify its magnetization orientation.

The second approach may prove to be very time-consuming to implement when the number of magnetization zones to be created on the substrate is high, and is therefore difficult to use on an industrial scale.

The first approach has the disadvantage that it requires the use of different materials having sufficiently different annealing temperatures under a magnetic field, which limits the choice of materials and complicates the manufacturing process.

The problem addressed is that of finding a new method for producing, on one and the same substrate, zones having respective different and fixed magnetization orientations.

SUMMARY OF THE INVENTION

The invention relates first of all to a method for producing a device comprising magnetic blocks resting on a substrate, the magnetic blocks having respective different magnetization directions, the method comprising steps of:

a) forming, in a stack of one or more layers of at least one antiferromagnetic material and one or more layers of at least one ferromagnetic material resting on a substrate, at least one first block and at least one second block, said blocks being longilineal and separate and extending respectively in a first main direction and in a second main direction, the first and the second main direction forming between them a first non-zero angle α, b) annealing said blocks at a temperature greater than or equal to a suitable temperature, determined as a function of the antiferromagnetic material.

Said suitable temperature corresponds to the ordering temperature of the antiferromagnetic material when the antiferromagnetic material is magnetically disordered. A disordered antiferromagnetic material exhibits no exchange coupling after deposition on a ferromagnetic material.

This suitable temperature corresponds to the blocking temperature, that is to say the temperature above which there is no longer any exchange coupling between an antiferromagnetic material and a ferromagnetic material in contact when the antiferromagnetic material is magnetically ordered.

This suitable temperature may also correspond to the Néel temperature, that is to say the temperature above which the antiferromagnetic material becomes paramagnetic.

An ordered antiferromagnetic material exhibits exchange coupling after deposition on a ferromagnetic material.

Due to the longilineal shape of the blocks, the magnetization can naturally align along the main directions thereof, that is to say the direction in which their length is measured, when an appropriate annealing is carried out.

The respective magnetizations of the blocks are fixed after annealing, during the cooling.

The stack may be formed in step a) in such a way as to comprise at least one ferromagnetic layer located between, and in contact with, two antiferromagnetic layers.

This may make it possible to block the magnetization of said layer of ferromagnetic material F in a defined direction during the ordering annealing.

According to one possible embodiment, the first block and the second block may be of parallelepiped shape.

According to another possible embodiment, the first block and/or the second block may themselves be in the form of parallelepiped sub-blocks that are separate from and parallel to one another.

The method may additionally comprise, during the annealing, the application of a magnetic field oriented in a direction that forms a second non-zero angle θ with said first main direction, the intensity of said magnetic field being varied during the annealing.

The application of the magnetic field may make it possible to saturate the magnetization in each block and thus to prevent the appearance of magnetic domains.

The intensity of the applied magnetic field is varied during the annealing so as to align simultaneously the magnetizations of the magnetic blocks of different orientations as close as possible to their respective main directions, while maintaining an orientation of the magnetic field at a given non-zero angle relative to the main directions of the blocks.

According to one possible embodiment, the first angle α, that is to say the angle formed between the blocks, may be 90°, whereas the second angle θ, that is to say the angle between the direction of the magnetic field and the main direction of the first block, may be 45°.

This makes it possible to use magnetic blocks having respective magnetizations oriented at 90° to one another.

In step b), during the application of the magnetic field, there can first of all be applied a magnetic field of given intensity greater than that of the magnetic saturation field of the blocks along their hard magnetization axis.

The given intensity can then be reduced so that the respective moduli of a projection of the magnetic field in the first main direction and of a projection of the magnetic field in the second main direction are greater than a saturation field value $H_L$ of the blocks along their easy magnetization axis, whereas the respective moduli of a projection of the magnetic field perpendicular to the first main direction and of a projection of the magnetic field perpendicular to the second main direction are lower than a saturation field value $H_w$ of the blocks along their hard magnetization axis.

The temperature can then be reduced, for example to the ambient temperature under this magnetic field intensity, so as to trap the magnetization directions of said ferromagnetic materials by the antiferromagnetic materials as close as possible to the main directions of said magnetic blocks.

It is possible to have:

$$H_L = \frac{Wt}{L^2}\left[\ln\left(\frac{4L}{W}\right) - 1\right] * 4 * \pi * Ms$$

$$Hw = 4 * \pi * Ms * t * \left[\frac{1}{t+W} - \frac{W}{L^2}\left[\ln\left(\frac{4L}{W}\right) - 1\right]\right]$$

where t is the thickness of the first block, L is the length of the first block, W is the width of the first block, and Ms is the saturation magnetization.

In step a), there can additionally be formed in the stack at least a third longilineal block extending in the first main direction.

The invention also relates to a method for producing a three-axis magnetic sensor comprising the implementation of a method as defined above.

BRIEF DESCRIPTION OF THE DRAWINGS

The present invention will be better understood on reading the description of examples of embodiments given solely by way of indication and without any limitation, reference being made to the appended drawings in which.

Identical, similar or equivalent parts in the different figures may bear the same numerical references so as to facilitate the passage from one figure to another.

The different parts shown in the figures are not necessarily on a uniform scale, in order to make the figures easier to read.

DETAILED DESCRIPTION OF PARTICULAR EMBODIMENTS

One example of a method for producing a device comprising, on one and the same substrate, zones of different magnetic orientations will now be given in connection with FIGS. 1A-1C, 2, 3A-3B.

The first step of this method, shown in FIG. 1, may consist in forming a stack of magnetic layers on a support 101, which may be for example a silicon layer of an SOI substrate (SOI denoting "silicon on insulator").

The stack is formed of an alternating arrangement of layers $104_1, \ldots, 104_m$ (where m is an integer for example equal to 3 in FIG. 1A) based on an antiferromagnetic material AF and layers $105_1, \ldots, 105_n$ where n is an integer for example between 4 and 25 (in FIG. 1A, n is for example equal to 2) based on a ferromagnetic material F.

The ferromagnetic material F may be formed on the basis of a soft magnetic material, having a strong saturation magnetization Ms typically greater than 1000 emu/cm³. The ferromagnetic material F may be based for example on an alloy of Fe, Co and Ni.

The antiferromagnetic material AF may for its part be an alloy based on Mn, for example of the type NiMn or PtMn or PdPtMn. In other examples, the antiferromagnetic material AF may be FeMn or IrMn or NiO or $Fe_2O_3$.

The stack 108 may be formed so that each layer based on ferromagnetic material F is located between two layers of antiferromagnetic material AF.

When layers of antiferromagnetic material AF are placed on each side of a layer of ferromagnetic material F, an exchange coupling at the interfaces between the antiferromagnetic material and the ferromagnetic material may make it possible to block the magnetization of the interposed layer of ferromagnetic material F in a defined direction during the ordering annealing.

Figure 1A:
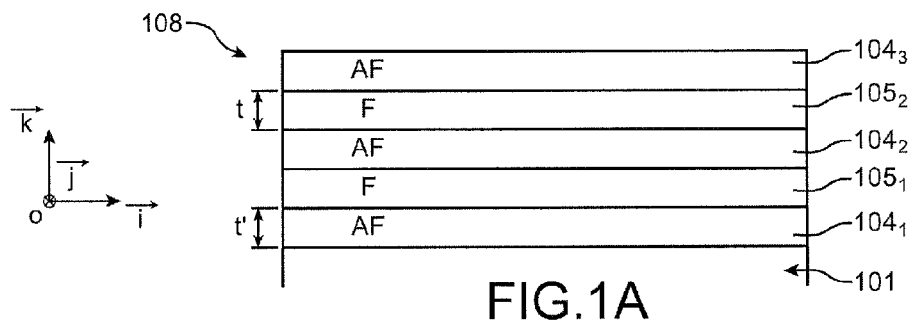
FIGS. 1A-1C and 2 show an example of a method for producing a device equipped with a plurality of magnetic blocks formed on one and the same substrate and having different magnetization directions.

The layers $104_1, \ldots, 104_n$ based on antiferromagnetic material AF may have a thickness t' (measured in a direction orthogonal to a main plane of the support 101 and parallel to the vector $\vec{k}$ of the reference system $[O; \vec{i}; \vec{j}; \vec{k}]$ defined in FIG. 1A) of for example between 2 and 50 nanometers, for example around 20 nanometers.

The layers $105_1, \ldots, 105_n$ based on ferromagnetic material may for their part have a thickness t (also measured in a direction parallel to the vector $\vec{k}$) of for example between 2 and 40 nanometers, for example around 10 nanometers.

The stack 108 may have a total thickness of for example around 200 to 600 nanometers.

Patterns are then formed in the stack 108 of layers by carrying out an etching of the layers, for example of the IBE type (IBE denoting "Ion Beam Etching").

Figure 1B:
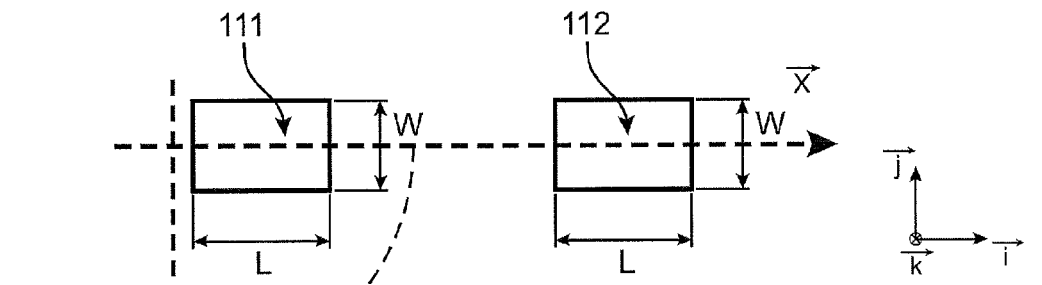

At least three separate and unattached blocks 111, 112, 113 are thus formed, each being formed of the stack of layers of antiferromagnetic material AF and ferromagnetic material F (FIG. 1B).

The blocks 111, 112, 113 each have an elongate or longilineal shape.

The blocks 111, 112, 113 may each be for example in the shape of a rectangular parallelepiped (FIG. 1B).

The blocks 111, 112, 113 may have a width W (measured in a plane parallel to the plane $[O; \vec{i}; \vec{j}]$) of for example between 20 and 500 micrometers, for example around 20 micrometers.

The length L (measured in a plane parallel to the plane $[O; \vec{i}; \vec{j}]$) may be for example between 20 and 500 micrometers, for example around 100 micrometers.

The aspect ratio L/W between the length and the width of the blocks may be high and may be for example at least 5.

Figure 3A:
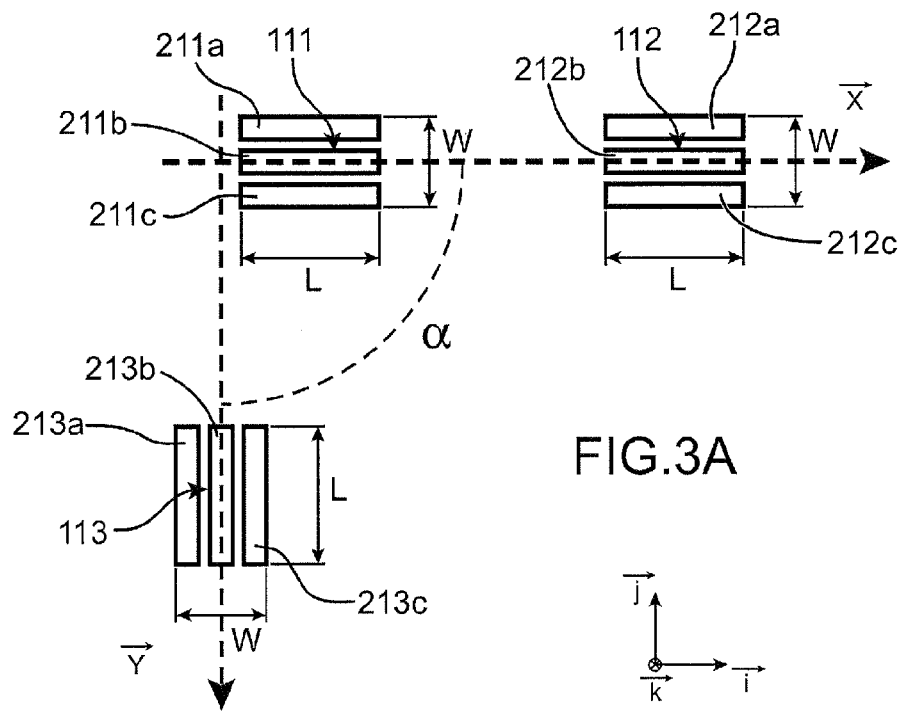
FIGS. 3A-3B show a device comprising magnetic blocks formed from a stack of ferromagnetic and antiferromagnetic layers, each block being subdivided into separate magnetic sub-blocks of parallelepiped shape.
Figure 3B:
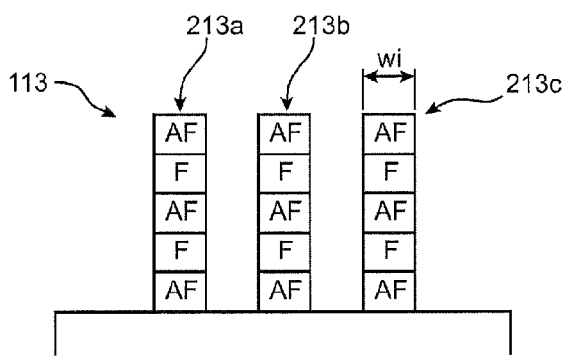

According to one variant, one or more of the blocks 111, 112, 113 may be in the form of a set of rectangular parallelepiped sub-blocks 211a, 211b, 211c, 212a, 212b, 212c, 213a, 213b, 213c that are parallel to and separate from one another (FIGS. 3A and 3B).

Subdividing the blocks 211, 212, 213 into parallelepiped sub-blocks, each having in particular a high aspect ratio with a length L to a width wi, for example $w_i/L \leq 10$, makes it possible to ensure a good alignment of the magnetizations along their respective main directions.

The sub-blocks 211a, 211b, 211c, 212a, 212b, 212c, 213a, 213b, 213c may have a width Wi of for example between 0.25 μm and 10 μm and preferably less than 5 μm.

At least two blocks 111, 113, 211a, 213a etched in the stack 108 are oriented in different main directions (the main directions of the blocks 111, 113 being defined by axes $\vec{X}$ and $\vec{Y}$ in FIG. 1B), forming between them an angle α of for example 90°. Some blocks 111, 112, 211a, 212a are oriented in respective main directions that are parallel to one another, or in one and the same direction.

Then, once the blocks 111, 112, 113 have been formed, a magnetic ordering annealing is carried out, the temperature of which is set so as to bring about an ordering of the antiferromagnetic material.

When the antiferromagnetic material AF is a disordered antiferromagnetic material, for example of the type NiMn or PtMn or PdPtMn, that is to say a material that does not exhibit any exchange coupling after deposition, the annealing step is carried out at a temperature greater than or equal to the ordering temperature of this material. This ordering temperature is typically above 250° C.

For an ordered antiferromagnetic material AF such as FeMn or IrMn or NiO or $Fe_2O_3$, that is to say a material that exhibits exchange coupling after deposition, the annealing step is carried out above the blocking temperature or the Néel temperature of this material, i.e. typically between 150° C. and 250° C.

The annealing may be carried out for example at a temperature greater than 260° C. when the antiferromagnetic material is PtMn.

The annealing may be carried out so that, during the latter, in particular at the start of the latter, there is applied a magnetic field $\vec{B}$, oriented so as to form a non-zero angle θ, which may be 45°, relative to the main directions $\vec{X}$ and $\vec{Y}$ of the blocks 111, 113.

The applied magnetic field may be a saturating field of intensity $\|\vec{B}\|$=Bsat greater than a predetermined field value corresponding to the saturation field of the blocks along their hard axis.

The hard axis is the axis for which the magnetic field applied in order to align the magnetization of the block is the greatest.

To saturate the magnetization and eliminate all the domains of the block 111, there is applied to the latter a saturating field greater than or equal to the saturation field along $\vec{Y}$.

In order to saturate the magnetization and eliminate all the domains of the block 111 when the latter is divided into sub-blocks 211a, 211b, 211c, there is applied to said block a saturating field greater than or equal to the saturation field of a sub-block along $\vec{Y}$.

In a case where blocks of different widths are used, a saturating magnetic field greater than the saturation field of the block of smallest width is applied.

Figure 1C:
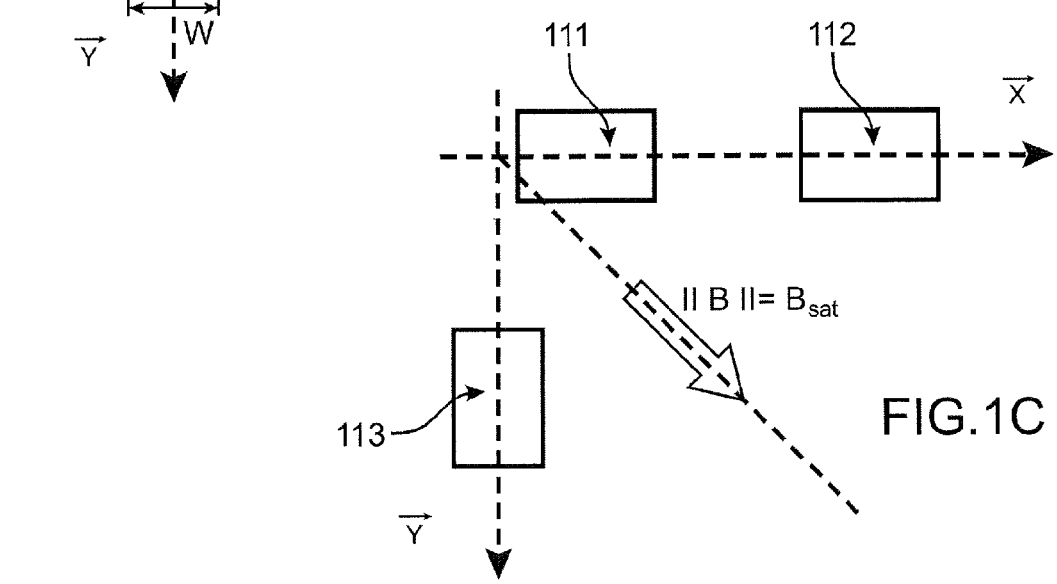
Figure 2:
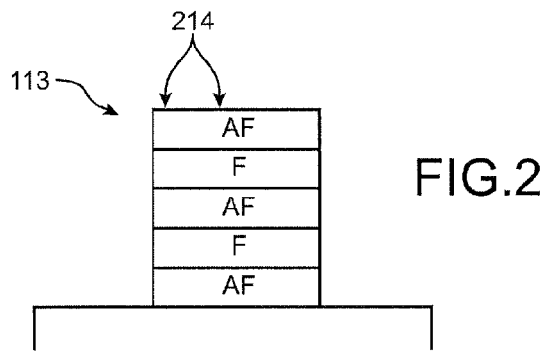

The saturating field applied may be much greater than said predetermined value and may be for example around 1 T or 2 T (FIG. 1C).

The intensity of the applied magnetic field is then reduced so that the modulus of the applied magnetic field projected along an axis $\vec{X}$, corresponding to the axis in which the length of the blocks 111 and 112 is measured, is greater than or equal to the saturation field $H_L$ of the blocks 111, 112, oriented along their easy magnetization axis. The modulus of the applied magnetic field projected along an axis $\vec{Y}$, corresponding to the axis in which the length of the block 113 is measured, is greater than or equal to the saturation field $H_L$ of the block 113, along its easy magnetization axis.

The modulus of the applied magnetic field projected along an axis $\vec{Y}$, corresponding to the axis in which the width of the blocks 111 and 112 is measured, is lower than the saturation field $H_w$ of the blocks along their hard magnetization axis.

The modulus of the applied magnetic field projected along an axis $\vec{X}$, corresponding to the axis in which the width of the block 113 is measured, is lower than the saturation field $H_w$ along the hard magnetization axis of the block 113.

The modulus of the applied magnetic field projected along the axis $\vec{Y}$ may be 20 times lower than the saturation field $H_w$ of the blocks 111, 112 along their hard magnetization axis, so as to ensure an alignment of the magnetizations in the blocks 111, 112 at 5° from their main direction.

The saturation field $H_L$ of a parallelepiped block having a main direction oriented along an axis $\vec{X}$ corresponding to the direction in which its length L is measured can be evaluated using the following formula:

$$H_L = \frac{Wt}{L^2}\left[\ln\left(\frac{4L}{W}\right) - 1\right] * 4 * \pi * Ms$$

The saturation field $H_W$ of this same block along the axis $\vec{Y}$ can be evaluated using the following formula:

$$Hw = 4 * \pi * Ms * t * \left[\frac{1}{t+W} - \frac{W}{L^2}\left[\ln\left(\frac{4L}{W}\right) - 1\right]\right]$$

where t is the thickness of all the ferromagnetic layers of the block, Ms is the saturation magnetization, L is the length of the block and W is the width thereof.

Thus, for example for blocks 111, 112 having a length of 100 μm, a width of 2 μm and a thickness of 100 nanometers, the following is obtained
$H_L$=1 G and
$H_W$=513 G.

By applying a field of 30 G at 45°, it is possible to obtain an orientation of the magnetization at better than 5° from the main axis of a block, regardless of the orientation thereof.

The modulus of the field projected along the second main direction is preferably less than 5% of Hw so as to ensure an alignment better than 5° relative to the first main direction and less than 2% for an alignment better than 2° relative to the first main direction.

In a case where the blocks 111, 112 are of different widths, then different alignments relative to the main directions of each block will be obtained.

For example, if the block 111 has a first width W=W1= 10 μm and the block 112 has a second width W=W2=2 μm, the blocks 111, 112 each having a length L=100 μm, and if for example a magnetic field of 30 G is applied, the magnetization in the block 111 will be misaligned by ~20° relative to its main direction whereas the misalignment will be only 5° in the block 112.

The following table gives examples of fields to be applied in order to ensure an alignment of 5° or 2° as a function of the dimensions of the blocks.

| ALIGNMENT AT 5° | | | | | | |
| --- | --- | --- | --- | --- | --- | --- |
| Length | 100 | 100 | 100 | 100 | 100 | 100 |
| Width | 10 | 5 | 2 | 1 | 0.25 | 0.25 |
| $H_L$ | 105 | 210 | 513 | 981 | 1800 | 3087 |
| $H_W$ | 3 | 1.8 | 0.9 | 0.5 | 0.3 | 0.17 |
| Modulus of H for θ = 45° | 7 | 14 | 33 | 63 | 116 | 199 |
| ALIGNMENT AT 2° | | | | | | |
| Length | 100 | 100 | 100 | 100 | 100 | 100 |
| Width | 10 | 5 | 2 | 1 | 0.5 | 0.25 |
| $H_L$ | 105 | 210 | 513 | 981 | 1800 | 3087 |
| $H_W$ | 3 | 1.8 | 0.9 | 0.5 | 0.3 | 0.17 |

| | | | | | | |
|---|---|---|---|---|---|---|
| Modulus of H for θ = 45° | 3 | 5 | 13 | 25 | 45 | 78 |

In order not to have to use excessively low magnetic fields in the annealing oven, it may be preferable to use blocks having a width W less than 2 µm.

The annealing temperature is then reduced so as to generate in each block an exchange between the antiferromagnetic material AF and the ferromagnetic material F, which makes it possible to fix definitively the magnetization directions.

At the end of the annealing, blocks 111 and 112 are obtained which have an identical magnetization orientation in a direction that may be substantially parallel to that of the axis $\vec{X}$ or may differ by less than 5° from that of the axis $\vec{X}$, whereas the block 113 has a magnetization of different orientation that is substantially orthogonal to that of the blocks 111 and 112.

A three-axis magnetic field sensor, for example of the strain gauge type, may be formed from the device thus produced.

To do this, according to one example, a passivation layer may in particular be deposited on the device except for the location at which a strain gauge is intended to be suspended.

This gauge, which may be metallic, is then produced by deposition followed by etching.

A deposition of a protective layer over the whole of the device, said protective layer being intended to protect in particular the strain gauge, may then be carried out.

Openings are then formed in the protective layer and in particular above the free ends of the strain gauge so as to establish the electrical contacts by metal deposition.

Figure 4:
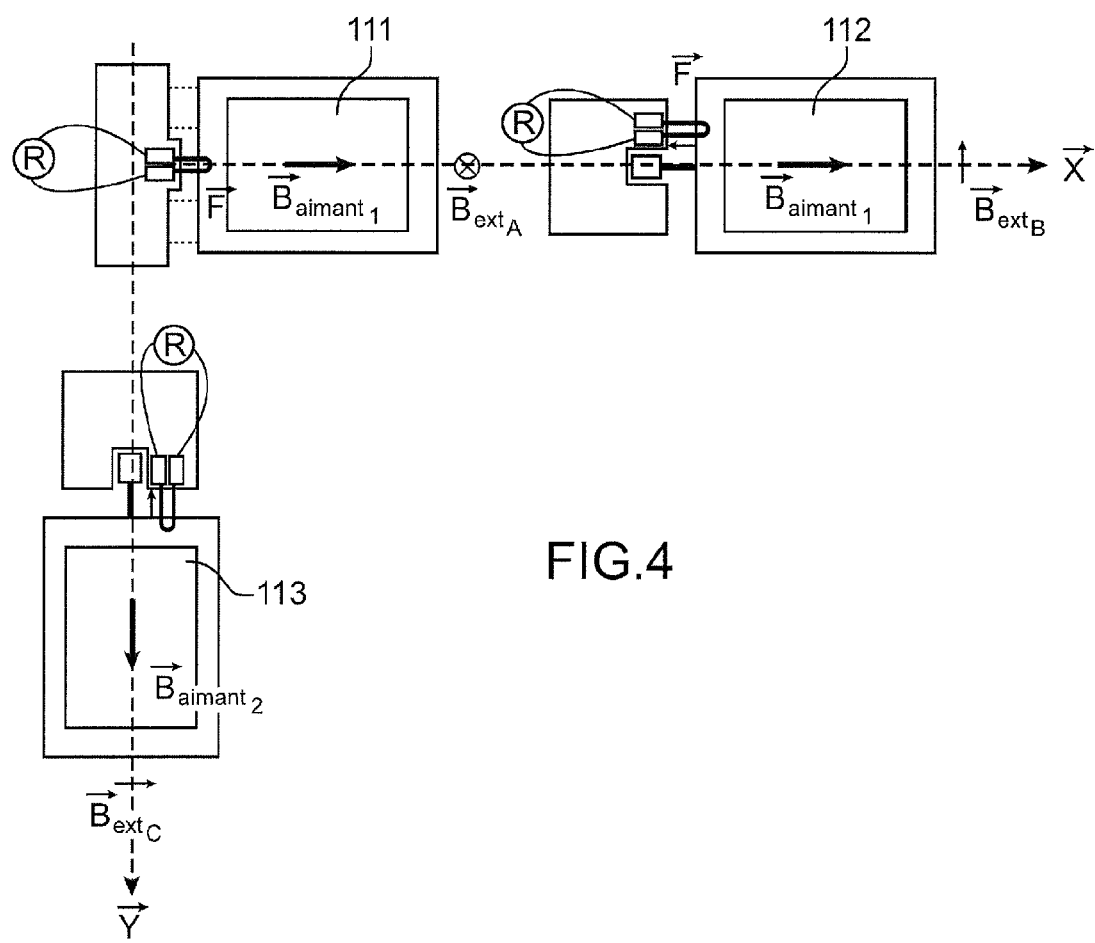
FIG. 4 shows an example of a three-axis sensor produced by means of a production method according to the invention.

One example of a magnetic field measurement sensor comprising components along 3 axes that are perpendicular to one another, that is to say carrying out a magnetic field measurement in three directions, is shown in FIG. 4.

This sensor comprises a first structure formed from the first block 111, which is able to measure a component $\vec{B}_{extA}$ of the magnetic field to be measured, parallel to an axis orthogonal to the main plane of the substrate, that is to say orthogonal to the axes $\vec{X}$ and $\vec{Y}$.

The sensor also comprises a second structure formed from the block 112, which is able to measure a component $\vec{B}_{extB}$ of the magnetic field parallel to the axis $\vec{Y}$, and a third structure 113 which comprises the same elements as the second structure. The strain gauge of this third structure, which experiences a compression or tension force parallel to the axis Y, is thus able to measure a component $B_{extC}$ of the magnetic field parallel to the axis $\vec{X}$. The magnetic block 113 of this third structure has a magnetic orientation $B_{magnet2}$ perpendicular to the magnetic orientation $B_{magnet1}$ of that of the blocks 111, 112 of the first and second structure.

If a strong disturbance, field such as that of a magnet were to reverse the magnetization orientation of the blocks 111, 112 or 113, this orientation would be restored as soon as the magnet is moved away from the device. Along the small axis, the magnetization might rotate in the presence of a magnetic disturbance but would return to its initial position at the end of the disturbance.

The invention claimed is:

1. Method for producing a device comprising magnetic blocks resting on a substrate (100) and which are magnetized in different directions, said method comprising:

a) a step of forming, in a stack of one or more layers of antiferromagnetic material and one or more layers of ferromagnetic material resting on a substrate, at least one first block and at least one second block, said blocks being separate, the first block and the second block being longilineal and extending respectively in a first main direction and in a second main direction, the first and the second main direction forming between them a first non-zero angle α, b) a step of annealing said blocks at a temperature greater than the ordering temperature or than the blocking temperature or than the Néel temperature of said antiferromagnetic material, this annealing step additionally comprising, during the annealing, the application of a magnetic field oriented in a direction that forms a second non-zero angle θ with said first and second main directions, and of an intensity that is varied during the annealing, so that during the application of the magnetic field:

first of all there is applied a magnetic field of given intensity greater than that of the saturation magnetic field $H_H$ of the blocks along their hard magnetization axis, the given intensity is then reduced so that the respective moduli of a projection of the magnetic field in the first main direction and of a projection of the magnetic field in the second main direction are greater than a saturation field value $H_L$ of the blocks along their easy magnetization axis, and the respective moduli of a projection of the magnetic field perpendicular to the first main direction and of a projection of the magnetic field perpendicular to the second main direction are lower than a saturation field value $H_w$ of the blocks along their hard magnetization axis.

2. Method according to claim 1, in which, after the annealing, the application of said magnetic field is maintained while allowing said blocks to cool.

3. Method according to claim 1, in which the first angle α is 90°, the second angle θ being 45°.

4. Method according to claim 1, in which:

$$H_L = \frac{Wt}{L^2}\left[\ln\left(\frac{4L}{W}\right) - 1\right] * 4 * \pi * Ms$$

$$Hw = 4 * \pi * Ms * t * \left[\frac{1}{t+W} - \frac{W}{L^2}\left[\ln\left(\frac{4L}{W}\right) - 1\right]\right]$$

where t is the thickness of the block, L is the length of the block, W is the width of the block and Ms is the saturation magnetization.

5. Method according to claim 1, the stack comprising at least one ferromagnetic layer (F) located between, and in contact with, two antiferromagnetic layers (AF).

6. Method according to claim 1, in which, during step a), there is additionally formed in a stack at least a third longilineal block extending in the first main direction.

7. Method according to claim 1, in which at least one of said blocks is itself in the form of a plurality of parallelepiped blocks that are separate from and parallel to one another.

8. Method for producing a three-axis magnetic sensor, comprising the implementation of a method according to claim 1.

* * * * *

UNITED STATES PATENT AND TRADEMARK OFFICE
CERTIFICATE OF CORRECTION

| | | |
|---|---|---|
| PATENT NO. | : 8,048,686 B2 | Page 1 of 1 |
| APPLICATION NO. | : 12/971702 | |
| DATED | : November 1, 2011 | |
| INVENTOR(S) | : Olivier Redon | |

It is certified that error appears in the above-identified patent and that said Letters Patent is hereby corrected as shown below:

Title Page should read
(73) Assignee:  Commissariat A L'Energie Atomique Et Aux Energies Alternatives
Paris (FR)

Signed and Sealed this
Third Day of April, 2012

David J. Kappos
*Director of the United States Patent and Trademark Office*

UNITED STATES PATENT AND TRADEMARK OFFICE
CERTIFICATE OF CORRECTION

PATENT NO. : 8,048,686 B2
APPLICATION NO. : 12/971702
DATED : November 1, 2011
INVENTOR(S) : Olivier Redon It is certified that error appears in the above-identified patent and that said Letters Patent is hereby corrected as shown below:

In the Claims

Col. 7, lines 61-63 and Col. 8, lines 1-33

The reference number (100) in Claim 1 is erroneous and has been deleted with Claim 1 now reading as follows:

1. Method for producing a device comprising magnetic blocks resting on a substrate and which are magnetized in different directions, said method comprising:
a) a step of forming, in a stack of one or more layers of antiferromagnetic material and one or more layers of ferromagnetic material resting on a substrate, at least one first block and at least one second block, said blocks being separate, the first block and the second block being longilineal and extending respectively in a first main direction and in a second main direction, the first and the second main direction forming between them a first non-zero angle $\alpha$,
b) a step of annealing said blocks at a temperature greater than the ordering temperature or than the blocking temperature or than the Néel temperature of said antiferromagnetic material, this annealing step additionally comprising, during the annealing, the application of a magnetic field oriented in a direction that forms a second non-zero angle $\theta$ with said first and second main directions, and of an intensity that is varied during the annealing, so that during the application of the magnetic field:
- first of all there is applied a magnetic field of given intensity greater than that of the saturation magnetic field $H_W$ of the blocks along their hard magnetization axis,
- the given intensity is then reduced so that the respective moduli of a projection of the magnetic field in the first main direction and of a projection of the magnetic field in the second main direction are greater than a saturation field value $H_L$ of the blocks along their easy magnetization axis, and the respective moduli of a projection of the magnetic field perpendicular to the first main direction and of a projection of the magnetic field perpendicular to the second main direction are lower than a saturation field value $H_w$ of the blocks along their hard magnetization axis.

Signed and Sealed this
Fifteenth Day of October, 2013

Teresa Stanek Rea
*Deputy Director of the United States Patent and Trademark Office*